United States Patent [19]
Kilchsperger

[11] Patent Number: 4,783,644
[45] Date of Patent: Nov. 8, 1988

[54] CONTINUOUSLY VARIABLE SLOPE DELTA MODULATION USING DIGITAL VECTOR FOR SLOPE CONTROL

[75] Inventor: Martin F. Kilchsperger, Islington, Canada

[73] Assignee: Amdahl Corporation, Sunnyvale, Calif.

[21] Appl. No.: 83,872

[22] Filed: Aug. 7, 1987

Related U.S. Application Data

[63] Continuation of Ser. No. 722,242, Apr. 11, 1985, abandoned.

[51] Int. Cl.$^4$ ............................................. H03M 3/02
[52] U.S. Cl. .................................. 341/166; 332/11 D; 375/28; 375/29; 375/30
[58] Field of Search ....... 340/347 AD, 347 R, 347 M, 340/347 NT; 332/11 D; 375/28-30

[56] References Cited

U.S. PATENT DOCUMENTS

| | | | |
|---|---|---|---|
| 4,042,921 | 8/1977 | Smith | 340/347 M X |
| 4,101,881 | 7/1978 | De Freitas | 375/28 X |
| 4,251,804 | 2/1981 | Scardina et al. | 340/347 AD X |

OTHER PUBLICATIONS

Glasbergen, This Versatile IC Digitizes Speech, Philips Telecommunication Review, vol. 39, No. 3, 9/1981, pp. 147-154.
The Engineering Staff of Analog Devices, Inc., Analog-Digital Conversion Handbook, 6/1972, pp. I-64 & I-65.
"Lowering PCM Encoding Rates Provides More Channels", Telephony, Sep. 12, 1983, pp. 34-48.
"Linear and Interface Integrated Circuits", Motorola, 1983, Series D, pp. 9-12 et. seq.

Primary Examiner—T. J. Sloyan
Attorney, Agent, or Firm—Fliesler, Dubb, Meyer & Lovejoy

[57] ABSTRACT

Disclosed is a digital encoding apparatus related to CVSD techniques which provides an improved signal. The apparatus includes a comparator, comparing an analog input signal to a reconstructed analog signal and for generating the digital outputs in a manner similar to the CVSD technique. An integrating means, receives a slope control signal and the digital outputs to generate the reconstructed analog signal. The slope control signal, according to the present invention, is generated in a slope control means which includes means responsive to n digital outputs from serial clock cycles for generating an m-dimensional digital vector signal, and means responsive to the m-dimensional digital vector signal for generating the slope control signal. The m-dimensional digital vector signal is converted to an analog slope control signal by generating a scalar product of the m-dimensional digital vector signal with an m-dimensional weighting vector. The m-dimensional weighting vector is set according to a parameter to provide optimal performance of the encoding apparatus. Also the scalar product signal is filtered and logarithmically converted to provide the slope control for the integrator.

7 Claims, 4 Drawing Sheets

FIG. —3

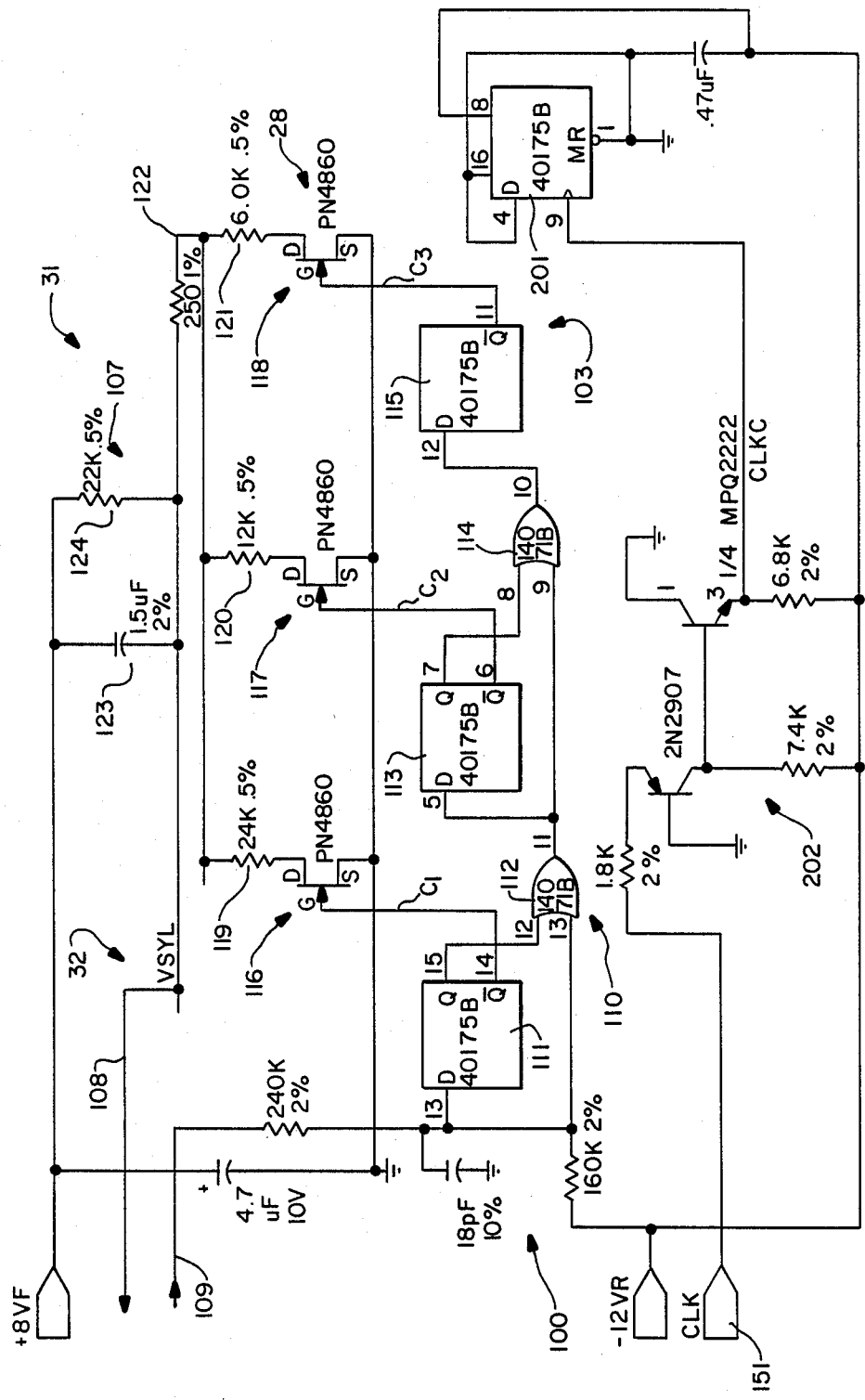
FIG.—5

CONTINUOUSLY VARIABLE SLOPE DELTA MODULATION USING DIGITAL VECTOR FOR SLOPE CONTROL

CONTINUING APPLICATION DATA

The present invention is a continuation of Ser. No. 722,242, filed Apr. 11, 1985, now abandoned.

FIELD OF THE INVENTION

The present invention pertains to digital encoding of analog signals, such as speech signals, and decoding of resultant digital signals. In particular, the present invention provides for the generation of digital output signals from analog signals and reconstruction of the analog signals based on the digital output signals.

BACKGROUND OF THE INVENTION

Modern speech communication systems, such as common carrier telephone systems, digitally encode analog speech signals for transmission as a digital signal. At the receiving end of the communication system, the digital signal is used to reconstruct the analog speech signal. The communication system must be able to reconstruct the speech signal at a quality that is intelligible at the receiving station.

An analog speech signal has a characterisitc of continuously varying amplitude with time. The rate at which the analog speech signal is sampled for digital encoding has an effect on the ability of the system to reconstruct the analog signal from the digital signal generated in the encoding process. Theoretically, for standard pulse code modulation the encoding and recovery process can be accomplished without substantially impairing the reconstructed analog signal if the rate at which samples are taken is at least twice the rate of the highest frequency component of the analog signal, that is, at the Nyquist rate. For high quality reconstruction of the analog signal, an even higher encoding rate is needed. The rate at which the analog signal is sampled is called the sampling rate of the encoding scheme. The corresponding bit rate of the communication link is a function of the sampling rate and the number of quantization bits per sample in the encoding scheme.

Thus for high quality reconstruction of the speech signal at the receiving station, a high bit rate is necessary. However a high bit rate digital signal requires a correspondingly wide bandwidth for transmission. So in order to maximize the utilization of a given communication system, a lower bit rate is desirable.

Several schemes are under investigation for lower bit rate encoding of analog speech data without sacrificing quality of the speech reconstructed at the receiving station. One technique is termed adaptive delta modulation or continuously variable slope delta modulation (CVSD).

The CVSD technique offers nearly the same voice quality as standard 64 kilobit pulse code modulation using only half of the digital bandwidth required for the standard systems. See, "lowering PCM Encoding Rates Provides More Channels", TELEPHONY, Sept. 12, 1983, pp. 34–48.

A CVSD encoder operates by comparing the received analog signal with the signal that has been reconstructed from the digital output of the encoder. When the incoming analog signal is at a level less than the reconstructed signal, then the digital output is set at a first value in response to a clock. When the incoming analog signal is greater than the reconstructed signal, then the digital output is set at another value in response to the clock.

The analog signal is reconstructed from the digital signal by supplying the digital signal to an integrator with a continuously variable slope. The continuously variable slope is caused in response to an algorithm which detects the occurrence of either a series of three or four consecutive ones or a series of three or four consecutive zeros in the digital signal. Upon the occurrence of either of those events, the slope is adjusted in order to attempt to track the incoming analog signal more closely.

More information about a particular CVSD encoder can be found in Motorola, Inc.'s product literature for the MC3417, MC3418, MC3417, MC3518 chip family. See, LINEAR AND INTERFACE INTEGRATED CIRCUITS, Motorola, 1983, Series D, pp. 9–12 et. seq.

FIG. 1 is a graph illustrating the digital encoding of an analog signal according to the CVSD technique. The analog signal 10 shown as a sinusoid. The digital encoded signal is shown at 11. And the reconstructed signal output from the integrator of the CVSD apparatus is shown at 12. As can be seen, the digital output 11 is high when the reconstructed signal 12 is at a level below the incoming analog signal 10. When the reconstructed signal 12 crosses the analog signal 10, such as at point 13, the digital signal 11 swings low on the next clock. This causes the sign of the slope of the reconstructed signal 12 from the integrator to reverse as shown along the segment 14. At the next clock cycle, the comparator will indicate that the analog signal 10 is above the reconstructed signal 12 once again and swing the digital output high at point 15 which reverses the sign of the slope of the reconstructed signal. This process continues for each clock cycle.

As can be seen in FIG. 1, the CVSD technique provides relatively close approximation of the analog signal input. However, the level tracking of the CVSD output signal 11 is relatively poor. Likewise the response of the CVSD digital output signal 11 to fast changes in the analog signal 10 is relatively poor.

SUMMARY OF THE INVENTION

The present invention provides an encoding technique related to the CVSD technique just described. However the present invention provides capability for an improved level tracking and improved response to fast changes in the analog signal not possible in the prior art without increases in the bit rate.

The present invention provides an apparatus responsive to a clock signal having serial clock cycles for digital encoding of an analog signal. The apparatus comprises a comparator means for comparing the analog signal to a reconstructed analog signal and generating, in clock cycles, digital outputs having a first value when the analog signal is greater than the reconstructed analog signal and having a second value when the analog signal is less than the reconstructed analog signal. An integrating means, responsive to a slope control signal, is included for generating the reconstructed analog signal. A slope control means, responsive to the digital outputs, generates a slope control signal in a given clock cycle.

The slope control means includes a means, responsive to n digital outputs from n serial clock cycles, for generating an m-dimensional digital vector signal, where n and m are integers greater than one. Further, the slope control means includes a means responsive to the m-dimensional digital vector signal for generating the slope control signal for the given cycle.

The m-dimensional digital vector signal identifies a plurality of conditions of the n digital outputs. Thus, in response to the condition of n digital outputs as indicated by the m-dimensional digital vector signal, the slope control means operates to control the integrating means to generate the reconstructed analog signal.

In a preferred embodiment, the means for generating a slope control signal further includes a means for storing an m-dimensional weighting vector, a means for generating a scalar product signal indicating a scalar product of the m-dimensional digital vector and the m-dimensional weighting vector during the given clock cycle, and a means, responsive to the scalar product signal, for generating the slope control signal.

BRIEF DESCRIPTION OF THE DRAWINGS

FIGS. 4 and 5 together make up a circuit diagram of a preferred embodiment of a digital encoding apparatus according to the present invention.

DETAILED DESCRIPTION

With reference to the Figures, a detailed description of the present invention is provided including a system overview and description of a particular circuit embodying the invention.

A. System Overview

Figure 1:
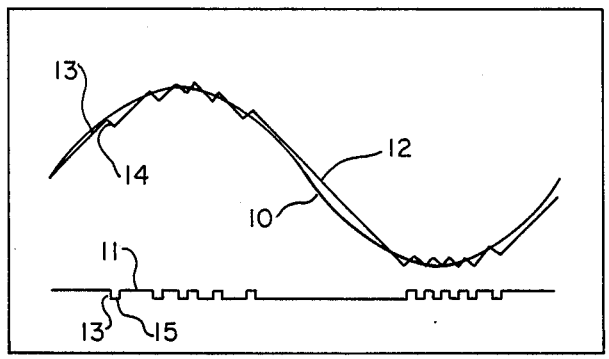
FIG. 1 is a graph used in illustrating the CVSD technique as discussed in the Background of the Invention.
Figure 2:
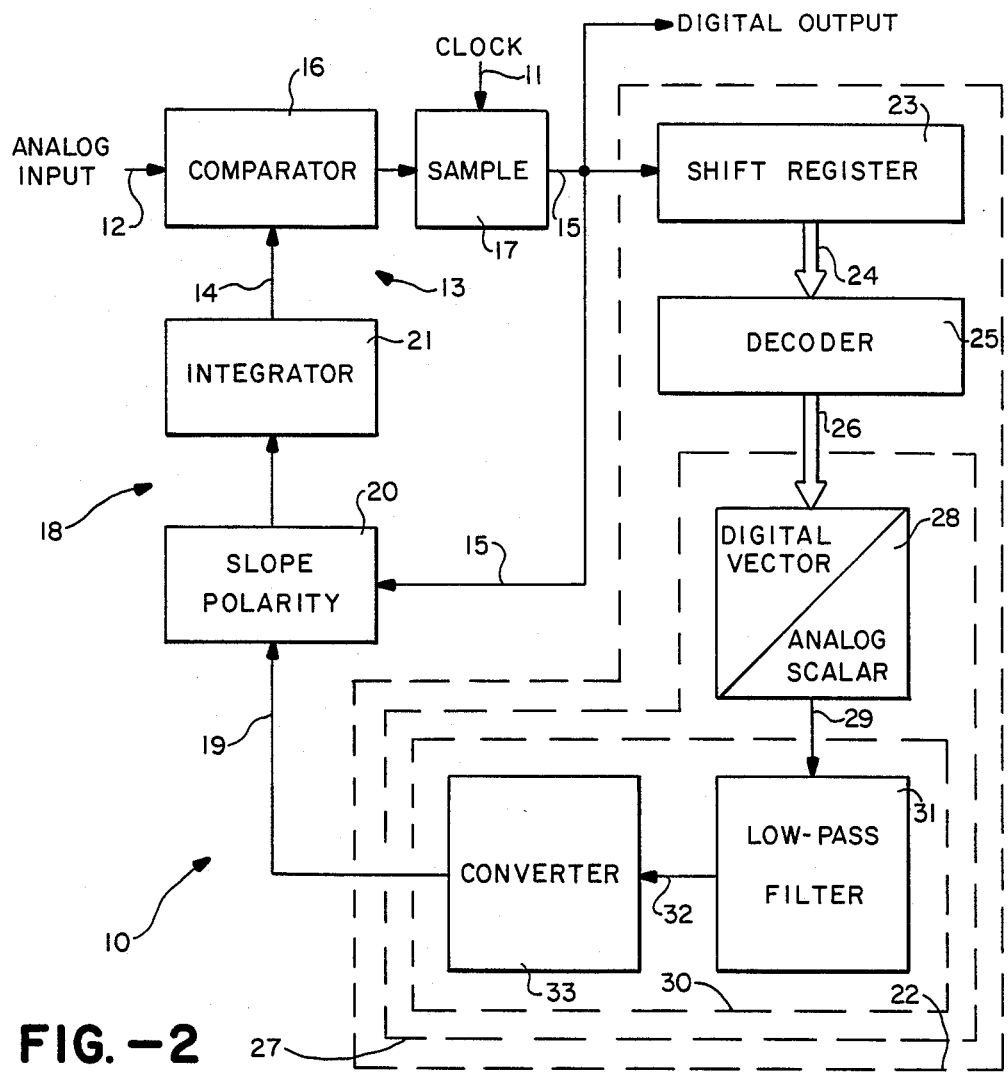
FIG. 2 is a block diagram of an encoding apparatus according to the present invention for generating the digital output from an analog signal.

FIG. 2 shows in apparatus 10, according to the present invention, responsive to a clock signal on line 11 for digital encoding of an analog input signal on line 12. The apparatus 10 comprises a comparator means 13 for comparing the analog signal to a reconstructed analog signal from line 14 and for generating during serial clock cycles, digital outputs on line 15 having a first value when the analog signal from line 12 is greater than the reconstructed analog signal from line 14 and a second value when the analog signal from line 12 is less than the reconstructed analog signal from line 14.

The comparator means 13 includes a comparator 16 which generates an output indicating whether the analog signal from line 12 is greater than or less than the reconstructed analog signal from line 14, and a sampling means 17 for sampling the output of the comparator 16 in response to the clock signal on line 11. The digital output from the sampling means 17 is provided to line 15. The digital output may then be transmitted over a communication system to a remote station for decoding and reconstruction of the analog signal as discussed below with reference to FIG. 3.

The reconstructed analog signal on line 14 is supplied by an integrating means 18, responsive to a slope control signal on line 19 and digital outputs on line 15, for generating the reconstructed analog signal. The integrating means 18 includes a slope polarity switch 20 and an integrator 21. The integrator 21 generates the reconstructed analog signal by supplying an output having a slope controlled by the slope control signal on line 19 and a polarity controlled by the slope polarity switch 20 in response the digital outputs from line 15. A slope control means, shown generally at 22, generates the slope control signal on line 19 in a current clock cycle in response to a plurality of digital outputs from line 15 from n serial clock cycles. The slope control means 22 may include a shift register 23 or other means for storing digital output from serial clock cycles. The n digital outputs from n serial clock cycles are supplied over line 24 to a decoder 25.

The decoder 25 comprises a means, responsive to the digital outputs on line 24, for generating an m-dimensional digital vector signal on line 26. Last, a means shown generally at 27, responsive to the m-dimensional vector signal from line 26 generates a slope control signal on line 19.

The means 27 for generating the slope control signal includes a means 28 for generating analog scalar product signal in responsive to the digital vector signal from line 26. The means 28 includes a means for storing a constant m-dimensional weighting vector. The means 28 generates the scalar product signal on line 29 which indicates a scalar product of the m-dimensional digital vector signal and m-dimensional weighting vector during a given clock cycle. Last, a means, shown generatlly at 30, responsive to the scalar product signal on line 29, generates the slope control signal.

The scalar product signal is a multilevel impulse, the level of which is determined in each clock cycle by changes in the m-dimensional digital vector signal.

The means 30, responsive to the scalar product signal on line 29, includes a filter means 31 for low pass filtering the scalar product signal to generate a filtered scalar product signal on line 32, and a converter means 33 for logarithmically converting the scalar product signal to generate the slope control signal.

The operation of the slope control means 22 can be theoretically described as follows. The shift register 23 stores n digital outputs from the current clock cycle and the (n−1)preceding serial clock cycles. Thus, the output on line 24 from the shift register 23 can be represented as an n-dimensional digital vector ($B_i$), for i=1 to n. The digital vector ($B_i$) will change during each clock cycle as the digital output from line 15 is passed through the shift register 23. Note that, in practice, a shift register for all n bits need not be used in all applications as shown in the preferred embodiment described with reference to FIGS. 4 and 5.

The decoder 25 receives the vector ($B_i$) and generates an m-dimensional digital vector signal which indicates a plurality of conditions of the n digital outputs as reflected in the vector ($B_i$).

In the preferred embodiment, the m-dimensional digital vector is defined as ($C_j$), for j=1 to m, where $C_j$ is true when $B_1$ through $B_{m+j}$ are equivalent, and n is equal to 2m. Satisfactory results are obtained with n=6 and m=3 for speech encoding systems.

The means 28 for generating the scalar product signal stores an m-dimensional weighting vector ($W_j$), for j=1 to m. A preferable vector speech encoding systems is defined by $(W_j) = 2^{j-1}k$, for j=1 to m. Thus for m=3, the weighting vector ($W_j$) would equal (k, 2k, 4k). The constant k is a parameter selected to optimize the companding ratio of the encoding apparatus 10 as discussed below.

The scalar product signal on line 29 indicates the value of the scalar product of the vector ($C_j$) and the vector ($W_j$). Thus, scalar output signal S is equal to the summation of $W_j$ times $C_j$, for j=1 to m, for each clock cycle.

The scalar product signal S supplied on line 29 passes through the filter means 31. Preferably, the filter means 31 is low-pass filter having a single pole with a time constant of about 33 milliseconds for a speech encoding system. The filtered scalar product signal on line 32 is supplied to a converter 33 which generates a slope control signal on line 19. In the preferred embodiment, the converter 33 has a logarithmic transfer function so that the slope control signal on line 19 increases exponentially as the filtered scalar product signal on line 32 increases.

For speech encoding systems, the combination of the filter means 31 and the converter means 33 provide a slope control signal on line 19 which has a time constant of approximately 6 milliseconds in the center of the useful dynamic range of levels for the signal.

As mentioned above, the constant k controls the companding ratio for the apparatus 10. It is found that good results are obtained by choosing appropriate companding ratios at various audio signal levels for speech encoding systems. It is found that a companding ratio of 13% is desirable for a signal level of the analog input on line 12 of +6 dBm. For a signal level of −40 dBm, a companding ratio of 3% generates good results.

The companding ratio is defined as a relative frequency of the occurrence of either four (4) consecutive 1's or four (4) consecutive 0's in the digital output on line 15. The companding ratio has a statistical correlation to the level of the incoming analog signal. The companding ratio can be decreased by increasing the average slope output from the integrator 21 and it can be increased by decreasing the average slope of the output from integrator 21. So according to the present invention by increasing the constant parameter k, the companding ratio is decreased and, correspondingly by decreasing the constant k, the companding ratio can be increased. Thus the companding ratio of the encoding apparatus 10 can be controlled by varying the constant k.

Figure 3:
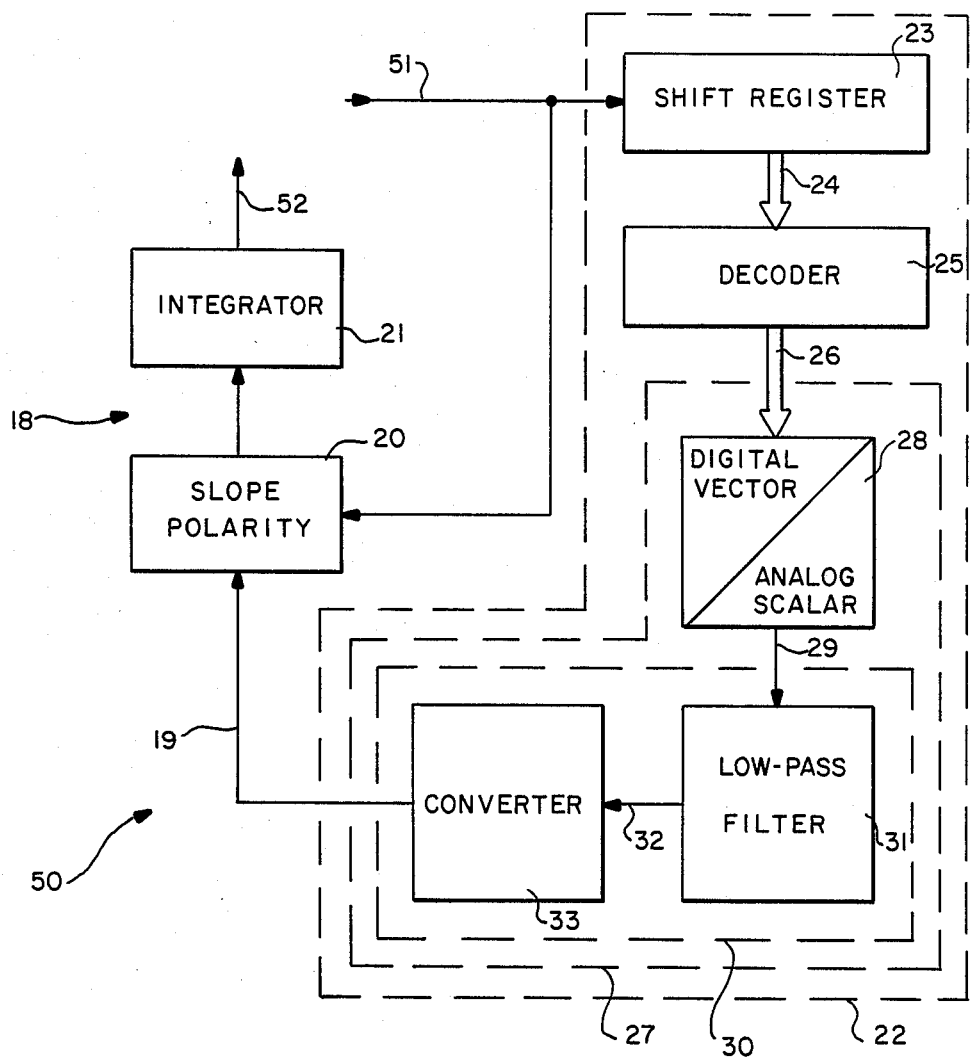
FIG. 3 is a block diagram of a decoding apparatus according to the present invention for receiving the digital output and generating a reconstructed analog signal.

FIG. 3 shows a block diagram of a receiving, or decoding, apparatus 50 according to the present invention for receiving the digital output signals from line 51, which may be for instance a transmission link, and for generating a reconstructed analog signal on line 52 for use at the receiving apparatus 50. As can be seen, the components in the receiving apparatus 50 of FIG. 3 are identical to the components of the slope control means 22 and the integrating means 18 shown in FIG. 2. Accordingly, the parts have been given identical reference numerals where appropriate. Also the description of the parts as provided above applies equally to the receiving apparatus 50 of FIG. 3. FIG. 3 illustrates that a receiving apparatus 50 need not have the comparator 16 and the sample 17 that a transmitting station must have as shown in FIG. 2.

By assuring that the slope control means 22 and the integrating means 18 at a receiving apparatus 50 operate in a manner substantially identical to those at the transmitting station, a true reconstructed analog signal 52 will be generated.

B. Description of Circuit Diagram

Figure 4:
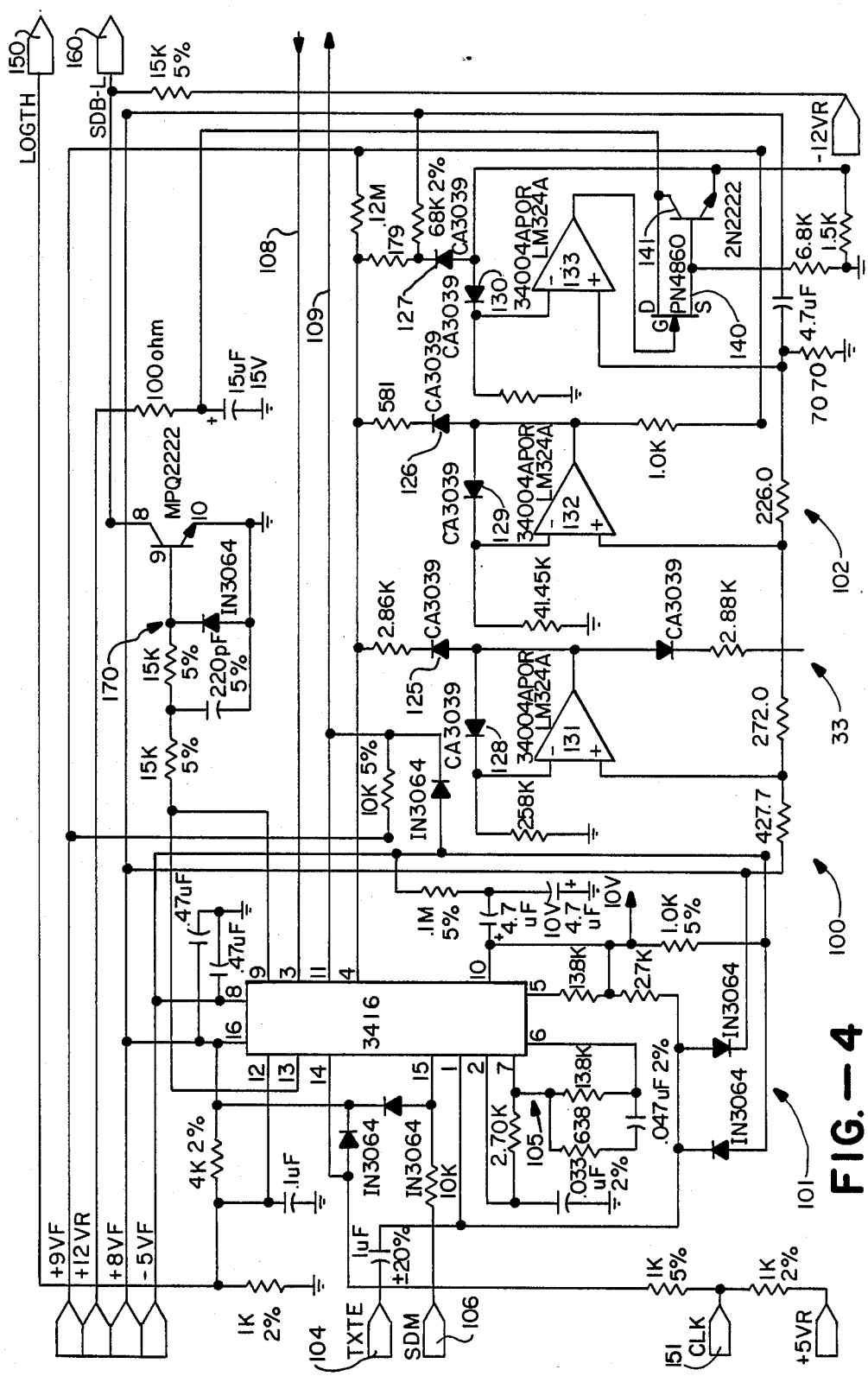

FIGS. 4 and 5 illustrate an encoder circuit 100 according to the present invention. The encoder circuit 100 is made up of three (3) distinct sections; an analog to digital converter section shown generally at 101, a logarithmic converter section shown generally at 102, and decoding logic and filter section shown generally at 103. The decoding logic and filter section 103 is depicted in FIG. 5, while the analog to digital converter section 101 and the logarithmic converter section 102 are shown on FIG. 4.

The analog to digital converter section 101 is implemented using a Motorola integrated circuit designated 3418. The characteristics of the 3418 can be found in Motorola Inc. data book entitled LINEAR AND INTERFACE INTEGRATED CIRCUITS, 1983, Series D. The numbered lines 1-16 entering the 3418 correspond to the pin connections for the chip. Details of the connection of the 3418 can be understood by a study of the specifications and applications information provided by Motorola in the LINEAR AND INTERFACE INTEGRATED CIRCUITS. Basically, the analog speech signal is received at the input line 104 and supplied to the pin connection 1 of the 3418. The 3418 compares the input analog signal from line 104 with the reconstructed analog signal from the integrator 105 which is fed back through pin 2 of the 3418. The 3418 includes the comparator 16 and sampler 17 as shown in FIGS. 2 and 3 and generates a digital output on pin 9 for transmission across line 160. A level shifting circuit 170 is connected between pin 9 and line 160 to make the signal on line 160 compatible with communication hardware using TTL-LS circuitry.

The resistor and capacitor network at pins 5, 6 and 7 of the 3418 define the basic characteristics of the integrator.

The signal supplied at pin 15 of the 3418 from line 106 is an enable/disable input which enables the 3418 when it is high and causes an output on line 9 of a 1−0 pattern when it is low. The 1−0 pattern is generated because the 3418 performs a function of a receiver apparatus 50 of FIG. 3 when connected with a digital input at pin 13. By connecting pin 13 in a feedback relationship with output pin 9, and disabling the encoding function by a low input at pin 15, the 1−0 digital output is generated. However when the input at pin 15 across line 106 is high, the feedback to pin 13 has no effect.

The pins 3, 4 and 11 of the 3418 are important to the present invention. The pin 3 receives an input from the filter 107 across line 108. The filter 107 is shown in FIG. 5. Thus, the signal on line 108 corresponds to the filtered scalar product signal on line 32 of FIG. 2.

The pin 4, which corresponds to line 19 of FIG. 2, receives the slope control signal from the logarithmic converter section 102 which corresponds to converter 33 of FIG. 2. The 3418 causes a voltage at pin 4 which matches the voltage of pin 3. Thus, the logarithmic converter in section 102 supplies a current at pin 4 which varies exponentially with respect to the voltage at pin 4. In the embodiment shown, as the voltage at pin 4 varies from about 0.3–1.2 volts, the current generated as the slope control signal varies from about 10 microamps to 2 milliamps.

Pin 11 of the 3418 in an output which indicates the occurrence of four (4) consecutive equivalent data bits, termed the coincidence output. The coincidence output from pin 11 is supplied across line 109 and goes low upon the occurrence of four (4) consecutive equivalent data bits.

The 3418 includes a shift register which stores serial data bits and generates the coincidence output at pin 11 upon the occurrence of 4 equivalent serial data bits.

The coincidence output is supplied across line 109 to the decoder logic shown generally at 110 of FIG. 5. The decoder logic 110 consists of a series of flip-flops whose $\overline{Q}$ outputs respectively make up the vector $(C_j)$ as described above. When the coincidence output from line 109 goes low, flip-flop 111 on the next clock cycle will cause $\overline{Q}$ to go high and Q to go low. The Q output from flip-flop 111 is supplied to the OR-gate 112 as one input. The other input to OR-gate 112 is the coincidence output on line 109. Thus when the coincidence output is low and Q of flip-flop of 111 is low, the D input of flip-flop 113 goes low. When the D input of flip-flop 113 goes low, the $\overline{Q}$ output goes high on the next clock and the Q output goes low. The Q output is supplied to the OR-gate 114 as one input. The other input to the OR-gate 114 is the output of the OR-gate 112. Thus, when the output of OR-gate 112 is low and the Q output of flip-flop 113 is low, the D input to flip-flop 115 goes low causing the $\overline{Q}$ output of flip-flop 115 to go high on the next clock.

As shown in FIG. 5, the flip-flops 111, 113, 115 are implemented using an integrated circuit designated 40175B which includes a fourth flip-flop 201 and has a single clock input, pin 9, and single power supply input, pins 1 and 8, as shown on the fourth flip-flop 201. Thus the clock signal at pin 9 of the flip-flop 201 is supplied in phase to each of the flip-flops 111, 113, 115, although the connections are not explicit in FIG. 5. Also, the single power supply connection powers each flip-flop 111, 113, 115.

Because the clock signal from line 151 is supplied at a TTl level compatible with the 3418 (See FIG. 4), a non-inverting level shift circuit 202 is provided that shifts the clock level to a CMOS level compatible with the 40175B.

Thus it can be seen that the $\overline{Q}$ outputs of the flips-flops 111, 113, and 115 correspond to $C_1$, $C_2$ and $C_3$, respectively, of the vector $(C_j)$, for $j=1$ to 3, as discussed above.

The FET transistors 116, 117, 118 receive the $\overline{Q}$ outputs from the flip-flops 111, 113 and 115, respectively, at their gates. When one of the FET transistors, such as 116, receives a high input at its gate, it turns on allowing current to pass through the resistor connected to its drain. The amount of current which is drawn through the turned on FET is determined by the value of the drain resistor. The drain resistors, 119, 120, and 121 correspond to the means for storing the weighting vector $(W_j)$ in the means 28 for generating the analog scalar product signal. Thus drain resistor 119 is twice the value of drain resistor 120 which is in turn twice the value of the drain resistor 121. The value of the resistance also is set in accordance with the parameter k as discussed above to provide the desirable companding ratio for the apparatus 10. The scalar product signal is supplied as a current across line 122. The current across line 122 is supplied to the filter 107 which is made up of the capacitor 123 and the resistor 124. The time constant of the filter 107 is about 33 milliseconds in the preferred embodiment. This filter 107 corresponds to the low pass filter 31 of FIG. 2. Thus, the voltage at line 108 is a filtered scalar product signal corresponding to line 32 of FIG. 2 and is supplied to pin 3 of the 3418 (see, FIG. 4).

As mentioned above, the voltage at pin 4 is made to track the voltage at pin 3 and draws a current from the logarithmic converter section 102. The logarithmic converter section 102 corresponds to the converter 33 of FIG. 2.

The logarithmic converter section 102 (FIG. 4) comprises diodes 125, 126 and 127 which provide the exponential characteristic for the current flowing into pin 4 of the 3418.

The diodes 128, 129 and 130 in conjunction with the OPamps 131, 132 and 133 provide temperature compensation to stabilize the transfer characteristic of the logarithmic converter section 102 over a range of operating temperatures.

The three stages of the logarithmic converter section 102, corresponding to the three diodes 125, 126 and 127, combine to provide a superior transfer characteristic over a wide range of currents. The first stage comprised of diode 125 provides low current characteristics. The second stage comprised of transistor 126 provides medium current characteristics. While the last stage comprised of diode 127 provides high current characteristics. At the high current characteristics, an additional current booster made up of transistors 140, 141 is provided for the embodiment shown.

The output at line 150 is a logic threshold output utilized for some applications. Input line 151 provides the clock input. Although it is not shown, the clock also is supplied to the decoder logic flip-flops 111, 113 and 115 for controlling the latching of the flip-flops. The balance of the inputs shown provide power supply voltages as shown.

The values for the resistors and the capacitors and the part numbers for the diodes's, transistors, OPamps, etc. are preferred values and components for an embodiment of the invention for speech encoding as presently understood. The detailed description of some of the connections for the particular I/Cs chosen to implement the parts of the circuits shown in FIG. 4 and 5 may not be shown or discussed in order to simplify the specification and drawing. However, any connections which are not shown or discussed can be determined from a study of the product literature for the particular I/C chosen.

A receiving apparatus 50 as shown in FIG. 3 can be implemented using equivalent components as those shown in FIGS. 4 and 5, supplying the transmitted digital signal such as across line 106 to the pin 13 of the 3418 (not shown). Pins 1, 2 and 9 are grounded according to the characteristics of the 3418 in the receiving apparatus application. A reconstructed analog signal would be supplied at the intergrator connected at pins 5, 6 and 7 of the 3418.

In summary, according to the present invention, CVSD encoding techniques can be improved by detecting a plurality selected conditions of a plurality of serial digital outputs and assigning a weight to each of those conditions according to desired operating characteristics to generate a slope control signal for the integrator that reconstructs the analog signal.

The foregoing description of a preferred embodiment of the invention has been presented for purposes of illustration and description. It is not intended to be exhaustive or to limit the invention to the precise form disclosed, and obviously many modifications and variations are possible in light of the above teaching. The speech signal enclouding embodiment was chosen and described in order to best explain the principles of the invention and its practical application to thereby enable others skilled in the art to best utilize the invention in various embodiments and various modifications as are suited to the particular use contemplated. It is intended that the scope of the invention be defined by the claims appended hereto.

I claim:

1. An apparatus responsive to a clock signal having serial clock cycles for digital encoding of a first analog signal, comprising:

comparator means for comparing the first analog signal to a reconstructed analog signal and generating, during clock cycles, digital outputs having a first value when the analog signal is greater than the reconstructed first analog signal and a second value when the first analog signal is less than the reconstructed analog signal;

integrating means, responsive to a slope control signal and the digital outputs, for generating the reconstructed analog signal; and slope control means, responsive to the digital outputs, for generating the slope control signal in a given clock cycle, including means, responsive to n digital outputs $B_i$, for $i=1$ to n, in serial clock cycles, for generating a m-dimensional digital vector signal, where n and m are integers greater than one, and where said m-dimensional digital vector signal is defined as $C_j$, for $j=1$ to $(n-m)$, wher $C_j$ is true when $B_1$ through $B_{m+j}$ are equivalent, and $n-2$ is greater than or equal to m, and means, responsive to the m-dimensional digital vector signal, for generating the slope control signal for the given clock cycle, including means for storing an m-dimensional weighting vector;

means for generating a scalar product signal indicating a scalar product of said m-dimensional digital vector signal and said m-dimensional weighting vector during the given clock cycle, and filter means for low pass filtering the scalar product signal to generate a filtered scalar product signal, and converter means for logarithmically converting the filtered scalar product signal to generate the slope control signal.

2. The apparatus of claim 1, wherein said means for storing an m-dimensional weighting vector, stores a vector defined as $(W_j) = 2^{j-1}k$, for $j=1$ to m, where k is equal to a preselected parameter.

3. An apparatus responsive to a clock signal having serial clock cycles for digital encoding of a first analog signal, comprising:

comparator means for comparing the first analog signal to a reconstructed analog signal and generating, during clock cycles, digital outputs having a first value when the first analog signal is greater than the reconstructed analog signal and a second value when the first analog signal is less than the reconstructed analog signal;

integrating means, responsive to a slope control signal and the digital outputs, for generating the reconstructed analog signal; and slope control means, responsive to the digital outputs, for generating the slope control signal in a given clock cycle, including means, responsive to n digital outputs $B_i$, for $i=1$ to n, in serial clock cycles, for generating a m-dimensional digital vector signal, where n and m are integers greater than one, and where said m-dimensional digital vector signal, is defined as $C_j$, for $j=1$ to $(n-m)$, where $C_j$ is true when $B_1$ through $B_{m+j}$ are equivalent, and means, responsive to the m-dimensional digital vector signal, for generating the slope control signal for the given clock cycle, including means for storing an m-dimensional weighting vector;

means for generating a scalar product signal indicating a scalar product of said m-dimensional digital vector signal and said m-dimensional weighting vector during the given clock cycle, and filter means for low pass filtering the scalar product signal to generate a filtered scalar product signal, and converter means for logarithmically converting the filtered scalar product signal to generate the slope control signal, wherein n is equal to 6 and m is equal to 3, and the digital outputs for the n serial clock cycles are defined as $B_1$, $B_2$, $B_3$, $B_4$, $B_5$ and $B_6$; and said m-dimensional vector is defined as $C_1$, $C_2$, and $C_3$, where $C_1$ is true when $B_1$ through $B_4$ are equivalent, $C_2$ is true when $B_1$ through $B_5$ are equivalent and $C_3$ is true when $B_1$ through $B_6$ are equivalent; and said means for storing an m-dimensional weighting vector stores a vector defined as $W_1$, $W_2$, and $W_3$, where $W_1$ is equal to k, $W_2$ is equal to 2k, and $W_3$ is equal to 4k, where k is a preselected parameter; and said scalar product signal indicates the sum of $C_1W_1 + C_2W_2 + C_3W_3$ during the given clock cycle.

4. An apparatus responsive to a clock signal having serial clock cycles for reconstructing a first analog signal in response to digital signals including a plurality of digital outputs in serial clock cycles indicating a digital encoding of the first analog signal, comprising:

integrating means, responsive to a slope control signal and the digital outputs, for generating the reconstructed analog signal; and slope control means, responsive to the digital outputs, for generating the slope control signal in a given clock cycle, including means, responsive to n digital outputs $B_i$, for $i=1$ to n, from n serial clock cycles, for generating an m-dimensional digital vector signal, where n and m are integers greater than one, and where said m-dimensional digital vector signal is defined as $C_j$, for $j=1$ to $(n-m)$, where $C_j$ is true when $B_1$ through $B_{m+j}$ are equivalent, and $n-2$ is greater than or equal to m; and means, responsive to the m-dimensional digital vector signal, for generating the slope control signal for the given clock cycle, including means for storing an m-dimensional weighting vector, means for generating a scalar product signal indicating a scalar product of said m-dimensional digital vector and said m-dimensional weighting vector during the given clock cycle, and means, responsive to the scalar product signal, for generating the slope control signal, including filter means for low pass filtering the scalar product signal to generate a filtered scalar product signal, and converter means for logarithmically converting the filtered scalar product signal to generate the slope control signal.

5. The apparatus of claim 4, wherein said means for storing an m-dimensional weighting vector, stores a vector defined as $W_j = 2^{j-1}k$, for $j=1$ to m, where k is equal to a preselected parameter.

6. An apparatus responsive to a clock signal having serial clock cycles for reconstructing a first analog signal in response to digital signals including a plurality of digital outputs in serial clock cycles indicating a digital encoding of the first analog signal, comprising:

integrating means, responsive to a slope control signal and the digital outputs, for generating the reconstructed analog signal; and slope control means, responsive to the digital outputs, for generating the slope control signal in a given clock cycle, including means, responsive to n digital outputs $B_i$, for $i=1$ to n, from n serial clock cycles, for generating an m-dimensional digital vector signal, where n and m are integers greater than one, and where said m-dimensional digital vector signal is defined as $C_j$, for $j=1$ to $(n-m)$, where $C_j$ is true when $B_1$ through $B_{m+j}$ are equivalent; and means, responsive to the m-dimensional digital vector signal, for generating the slope control signal for the given clock cycle, including means for storing an m-dimensional weighting vector, means for generating a scalar product signal indicating a scalar product of said m-dimensional digital vector and said m-dimensional weighting vector during the given clock cycle, and means, responsive to the scalar product signal, for generating the slope control signal, including filter means for low pass filtering the scalar product signal to generate a filtered scalar product signal, and converter means for logarithmically converting the filtered scalar product signal to generate the slope control signal, wherein n is equal to 6 and m is equal to 3, and the digital outputs for the n serial clock cycles are defined as $B_1$, $B_2$, $B_3$, $B_4$, $B_5$ and $B_6$; and same m-dimensional vector is defined as $C_1$, $C_2$, and $C_3$, where $C_1$ is true when $B_1$ through $B_4$ are equivalent, $C_2$ is true when $B_1$ through $B_5$ are equivalent and $C_3$ is true when $B_1$ through $B_6$ are equivalent; and wherein said means for storing an m-dimensional weighting vector stores a vector defined as $W_1$, $W_2$, and $W_3$, where $W_1$ is equal to K, $W_2$ is equal to 2k, and $W_3$ is equal to 4k, where k is a preselected parameter; and wherein said means for generating a scalar product signal generates a signal which indicates the sum of $C_1W_1 + C_2W_2 + C_3W_3$ during the given clock cycle.

7. The apparatus of claims 1, 3, 4 or 6, wherein said filter means and said converter means provide a slope control signal characterized by a time constant of substantially six milliseconds

* * * * *